United States Patent [19]

Beech et al.

[11] Patent Number: 4,654,601

[45] Date of Patent: Mar. 31, 1987

[54] DEMODULATOR FOR TELEVISION SIGNALS WITH FEEDBACK TO CORRELATE FRAMES OR LINES

[75] Inventors: Brian H. Beech; Simon Moore, both of Hampshire, United Kingdom

[73] Assignee: Independent Broadcasting Authority, London, England

[21] Appl. No.: 777,785

[22] PCT Filed: Jan. 17, 1985

[86] PCT No.: PCT/GB85/00021

§ 371 Date: Sep. 17, 1985

§ 102(e) Date: Sep. 17, 1985

[87] PCT Pub. No.: WO85/03399

PCT Pub. Date: Aug. 1, 1985

[30] Foreign Application Priority Data

Jan. 17, 1984 [GB] United Kingdom ............... 8401205

[51] Int. Cl.[4] .............................................. H03D 3/18
[52] U.S. Cl. ...................................... 329/122; 329/50
[58] Field of Search ................. 329/50, 110, 122, 145, 329/154, 168, 169; 331/20; 375/81, 120; 455/214, 337; 358/23, 149

[56] References Cited

U.S. PATENT DOCUMENTS 3,626,301 12/1971 Develet, Jr. ........................ 329/122
4,409,562 10/1983 Kurihara ....................... 329/122 X
4,451,792 5/1984 Gay .............................. 455/214 X
4,509,017 4/1985 Andren et al. ................. 455/214 X

OTHER PUBLICATIONS

Arndt, G. D. et al., "Video Signal Improvement Using Comb Filtering Techniques", *IEEE Xactions on Communications Technology*, vol. COM-21, No. 4, Apr. '73, pp. 331-336.

*Primary Examiner*—Eugene R. LaRoche
*Assistant Examiner*—David Mis
*Attorney, Agent, or Firm*—Watson Cole Grindle & Watson

[57] ABSTRACT

A demodulator for television signals includes a feedback loop which incorporates a delay for feeding back a first portion of a modulating signal to be compared with a following portion of the signal. This allows correlation of the modulating signals between the first portion of the signal and the following portion. Such correlation can be applied in feedback type demodulation such as phase-locked loops, to increase the threshold performance of the loop. The circuitry can be applied in normal demodulation circuits to effect a frequency tracking circuit allowing the use of a band pass filter with a narrower band than would be normally allowable.

9 Claims, 2 Drawing Figures

4,654,601

DEMODULATOR FOR TELEVISION SIGNALS WITH FEEDBACK TO CORRELATE FRAMES OR LINES

BACKGROUND OF THE INVENTION

The present invention relates to a demodulator for television signals and more particularly to a modification of a demodulator to improve its performance e.g. its threshold performance.

Feedback-type demodulators such as phase locked loops have been proposed for television signals in order to improve the performance of the demodulator. The effect of the feedback type demodulator is to extend threshold capability over that of a different type of demodulator. The amount of extension available depends on the feedback loop parameters as does the ability of the loop to track transients in the modulating signal. However, these are conflicting requirements which means that a compromise must be reached which in turn limits the threshold improvement.

SUMMARY OF THE INVENTION

It is an object of the present invention to improve the ability of a feedback-type demodulator to track the modulating signal to allow a better compromise to be reached which in turn allows an increased threshold improvement.

The present invention correlates the modulating signals between one portion and the next by introducing a delayed signal into the loop to reduce correlation errors.

Preferably the correlation is between frames but may be between lines.

BRIEF DESCRIPTION OF THE DRAWINGS

Features and advantages of the present invention will become apparent from the following description of an embodiment thereof given by way of example with reference to the accompanying drawings, in which.

DETAILED DESCRIPTION OF A PREFERRED EMBODIMENT

The present invention will be described in relation to its use with a phase locked loop demodulator but the same technique could be applied to other feedback-type demodulators. The technique to be described is applicable to a number of modulating signal systems e.g. NTSC, PAL and SECAM as well as the proposed multiplexed analogue component system (MAC).

Figure 1:
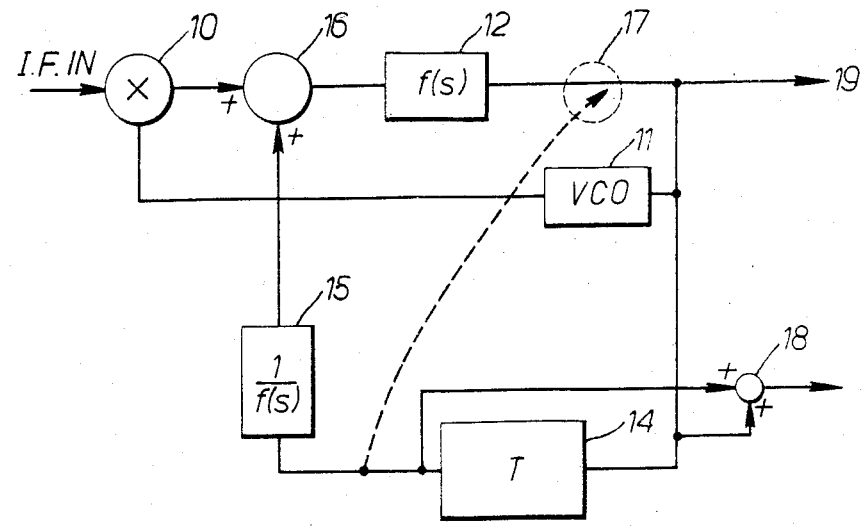
FIG. 1 shows a block diagram of an improved phase locked loop according to the present invention.

Referring now to FIG. 1, this shows a conventional phase locked loop comprising a phase comparator 10 for comparing the phase of the output of a voltage controlled oscillator 11. The output of the phase comparator 10 is fed to a loop amplifier and filter 12 which has a transfer function f(s) and to whose output is connected the input of the voltage controlled oscillator 11. The video output is taken from the junction 19 between the output of the loop amplifier and filter 12 and the oscillator 11.

This basic circuit is modified by introducing a delayed signal into the loop. This is achieved by connecting a delay circuit 14 so as to delay a signal representing one portion of a television picture with respect to the next portion so as to reduce the error at the output of the phase comparator 10 towards zero. The overall result is to produce an error signal at the output of the phase comparator 10 which corresponds to a difference signal depending on the two portions to be correlated rather than the modulating signal itself. The two signal portions to be correlated are determined by the length of the delay introduced by the circuit 14. It is preferred to use a frame delay but a line delay could be used.

The output of the delay circuit 14 can be connected to a summing network 16 via a circuit 15 which has a transfer function which is the inverse of the transfer function to the loop amplifier and filter 12.

If the network 16 is in the position shown in FIG. 1 between the phase comparator 10 and the loop amplifier and filter 12, then the circuit 15 is required. However, it is possible to connect the delay circuit into the loop after the loop amplifier and filter 12 as shown by the alternative summing point 17, in which use the circuit 15 is not required.

The above circuit does not produce a time lag at the output of the demodulator as far as the signal itself is concerned.

A noise reduced output can be obtained by summing the signals at the input and output of the delay circuit 14, shown by summing circuit 18. This might produce undesirable temporal effects. To counteract this, the weighting factors could be made dependent on the noise situation so that at high S/N ratios, any temporal effect is eliminated.

It is preferred to use the above circuit on a non-scrambled signal but it is possible to use the circuit with scrambled signals particularly where a scrambling system is used which preserves a zero frame difference signal. This would mean that when the delay circuit 14 is a frame delay the circuit could be used for a scrambled signal without requiring any increase in the complexity of the receiver. With other scrambling techniques it would be necessary to descramble the signal passing through the delay circuit 14 and to rescramble it according to the format of the next frame.

Figure 2:
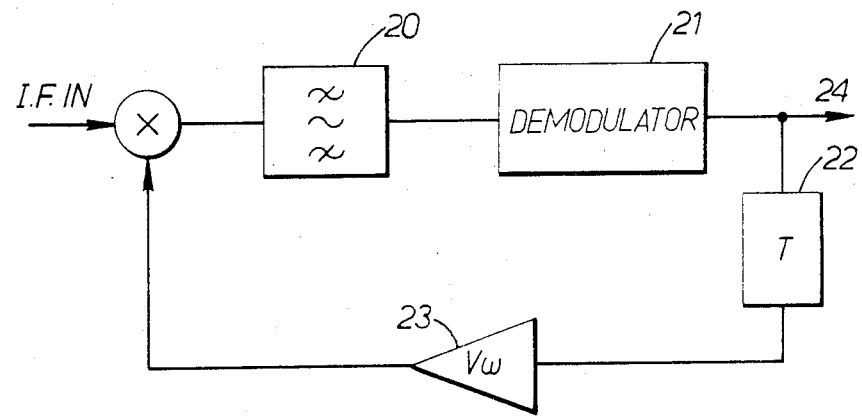
FIG. 2 shows a modification of FIG. 1 as applied to a frequency tracking loop.

The technique of adding a delay can be applied, as shown in FIG. 2, to produce a frequency tracking loop. In FIG. 2 an I.F input is fed through a narrow bandpass filter 20 to a demodulator circuit 21 whose output at 24 is taken as the video output. A delay circuit 22 has its input connected to the output of the demodulator 21 and its output connected to a voltage controlled oscillator 23. The output of the oscillator 23 is summed with the I.F. input at the input of the filter 20.

This circuit permits the use of a filter 20 which is somewhat narrower than would normally be allowable. The action of the feedback circuit is to eliminate truncation effects on static detail.

We claim:

1. A demodulator circuit for demodulating television signals, said demodulating circuit comprising an input for modulated signals, an output for demodulated signals, demodulating means for demodulating the modulated signals applied at said input, feedback loop means for feeding back a signal from a first point in said demodulating circuit to a second point, comparing means at said second point for comparing the feedback signal with the signal at said second point, delay means being provided for delaying said feedback signal, whereby the comparison of the delayed feedback signal and the signal at said second point reduces correlation errors, said demodulating means is a phase locked loop including a phase comparator means, loop amplifier and filter means and voltage controlled oscillator means, respectively connected in series in the loop, the input for the modulated signals being one input to the phase comparator and the output for the demodulated signals being between the loop amplifier and filter means and the voltage controlled oscillator means, said first point is between said loop amplifier and filter means and said voltage controlled oscillator means, said second point is between said phase comparator means and said loop amplifier and filter means, and wherein an amplifier means is included in said feedback loop, said amplifier means having a transfer function which is the inverse of the transfer function of said loop amplifier.

2. A demodulating circuit in accordance with claim 1, wherein said comparing means at said second point is a summing network, said summing network having one input for the signal at said second point, another input for the feedback signal, and an output for the resulting sum of the signals.

3. A demodulating circuit in accordance with claim 1, wherein said delay means is a delay circuit included in said feedback loop.

4. A demodulating circuit in accordance with claim 3, wherein there is provided a summing network, said summing network having one input connected to said first point, another input connected to the output of said delay circuit, and an output, whereby noise reduced demodulated signals can be taken from said output.

5. A demodulating circuit in accordance with claim 1, wherein said delay means applies a delay of one frame length of said television signal.

6. A demodulator circuit for demodulating television signals, said demodulating circuit comprising an input for modulated signals, an output for demodulated signals, demodulating means for demodulating the modulated signals applied at said input, feedback loop means for feeding back a signal from a first point in said demodulating circuit to a second point, comparing means at said second point for comparing the feedback signal with a signal at said second point, delay means for delaying said feedback signal, whereby the comparison of the delayed feedback signal and the signal at said second point reduces correlation errors, said demodulating means is a conventional demodulator, and said output for demodulated signals is the output of said conventional demodulator, said first point is at the output for demodulated signals of said conventional demodulator, and said second point is at said input for modulated signals, and wherein a voltage controlled oscillator means is included in said feedback loop, the output of said voltage controlled oscillator means being connected to said second point.

7. A demodulating circuit in accordance with claim 6 wherein said comparing means at said second point is a mixer circuit, said mixer circuit having one input for the signal at said second point, another input for the feedback signal, and an output for the resulting mixed signal.

8. A demodulating circuit in accordance with claim 6 wherein a narrow band intermediate frequency filter is included between the input for the modulated signals and the input to the conventional demodulator.

9. A demodulator circuit for demodulating television signals, said demodulating circuit comprising an input for modulated signals, an output for demodulated signals, demodulating means for demodulating the modulated signals applied at said input, feedback loop means for feeding back a signal from a first point in said demodulating circuit to a second point, comparing means at said second point for comparing the feedback signal with a signal at said second point, delay means being provided for delaying said feedback signal, whereby the comparison of the delayed feedback signal and the signal at said second point reduces correlation errors, said demodulating means is a phase locked loop including a phase comparator means, loop amplifier and filter means and voltage controlled oscillator means, respectively connected in series in the loop, the input for the modulated signals being one input to the phase comparator and the output for the demodulated signals being between the loop amplifier and filter means and the voltage controlled oscillator means, said first point is between said loop amplifier and filter means and said voltage controlled oscillator means, and said second point is between said loop amplifier and filter means and said first point.

* * * * *